United States Patent
Chen et al.

(10) Patent No.: US 9,293,354 B2
(45) Date of Patent: Mar. 22, 2016

(54) APPARATUS AND METHOD FOR CALIBRATING LITHOGRAPHY PROCESS

(75) Inventors: Chun Chi Chen, Shanghai (CN); Sai Hung Lam, Shanghai (CN); Wei Zhu, Shanghai (CN); Chin Yu Chen, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 951 days.

(21) Appl. No.: 12/891,738

(22) Filed: Sep. 27, 2010
(Under 37 CFR 1.47)

(65) Prior Publication Data

US 2011/0279797 A1     Nov. 17, 2011

(30) Foreign Application Priority Data

Sep. 28, 2009   (CN) .......................... 2009 1 0057967

(51) Int. Cl.
   *G03B 27/42*    (2006.01)
   *H01L 21/67*    (2006.01)
   *G03F 7/20*     (2006.01)
   *H01L 23/544*   (2006.01)

(52) U.S. Cl.
   CPC ...... *H01L 21/67253* (2013.01); *G03F 7/70516* (2013.01); *H01L 23/544* (2013.01); *H01L 2223/54433* (2013.01); *H01L 2924/0002* (2013.01)

(58) Field of Classification Search
   CPC . G03F 7/70516; G03F 9/7003; G03F 9/7088; G03F 9/7046; G03F 9/7019; G03F 9/7069; G03F 9/7076; G03F 7/70608; G03F 7/70725; G03F 9/7034; G03F 9/7084; G03F 7/0035; G03F 7/7085; H01L 21/67253; H01L 2223/54433; H01L 23/544
   USPC ............... 355/53, 55, 67; 250/310; 427/9, 82, 427/240, 282, 286
   See application file for complete search history.

(56) References Cited

U.S. PATENT DOCUMENTS

| | | | | |
|---|---|---|---|---|
| 4,600,597 | A  * | 7/1986  | White et al. ...................... | 427/9 |
| 6,277,658 | B1 * | 8/2001  | Jeng et al. ........................ | 438/14 |
| 6,412,326 | B1 * | 7/2002  | Hubbard et al. ................ | 73/1.01 |
| 7,473,502 | B1 * | 1/2009  | Ausschnitt et al. ............. | 430/22 |
| 2002/0197749 | A1* | 12/2002 | Knight et al. .................... | 438/14 |
| 2003/0038383 | A1* | 2/2003  | Sakaguchi ..................... | 257/797 |
| 2003/0081188 | A1* | 5/2003  | Suzuki ............................ | 355/51 |
| 2006/0044571 | A1* | 3/2006  | Whitefield et al. ........... | 356/625 |
| 2009/0001616 | A1* | 1/2009  | Bonora et al. ................. | 257/797 |
| 2009/0087559 | A1* | 4/2009  | Yoshihara et al. ............ | 427/240 |

* cited by examiner

*Primary Examiner* — Mesfin T Asfaw
(74) *Attorney, Agent, or Firm* — Kilpatrick Townsend & Stockton LLP (57) ABSTRACT

A calibration wafer may bear one or more different mark types to facilitate inspection of a lithography process. A first mark type may be located on the outer peripheral portion of the wafer to indicate the desired boundary of an edge bead removal (EBR) region. A second mark type may be located on an outer peripheral portion of the wafer to indicate the desired boundary of a wafer edge expose region (WEE). A third mark type may indicate the border of a portion of the wafer expected to bear a wafer identification mark. A fourth mark type may be located at the center of the wafer to allow for precise and uniform application of liquid photoresist material to the calibration wafer. The calibration wafer may be employed in methods of rapidly and easily assessing the accuracy of various phases of photolithography processes.

19 Claims, 4 Drawing Sheets

APPARATUS AND METHOD FOR CALIBRATING LITHOGRAPHY PROCESS

CROSS-REFERENCES TO RELATED APPLICATIONS

This application claims priority to Chinese Application No. 200910057967.2, filed on Sep. 28, 2009, commonly assigned, and incorporated in its entirety by reference herein for all purposes.

BACKGROUND OF THE INVENTION

Embodiments of the present invention are directed to integrated circuits and the processing for the manufacture of semiconductor devices. More particularly, the invention provides a method for monitoring a track tool for lithography process for the manufacture of integrated circuits. But it would be recognized that the invention has a much broader range of applicability. For example, the invention can be applied to a variety of devices such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of a semiconductor process that is important to make smaller and smaller devices is lithography process for the manufacture of integrated circuits. Lithography process includes steps of depositing a photoresist material, patterning and developing the photoresist material. Unfortunately, conventional ways to monitor the steps in lithography process have become difficult to perform in an efficient and accurate manner. For example, critical components or parts in a track tool for lithography process are aligned manually, incurring error and inconsistency.

From the above, it is seen that an improved technique for processing semiconductor devices is desired.

BRIEF SUMMARY OF THE INVENTION

According to the present invention, techniques for processing integrated circuits for manufacturing semiconductor devices are provided. More particularly, the invention provides a method for calibrating a track tool used in a lithography process for patterning semiconductor integrated circuits. But it would be recognized that the invention has a much broader range of applicability.

A calibration wafer may bear one or more different mark types to facilitate inspection of a lithography process. A first mark type may be located on the outer peripheral portion of the wafer to indicate the desired boundary of an edge bead removal (EBR) region. A second mark type may be located on an outer peripheral portion of the wafer to indicate the desired boundary of a wafer edge expose region (WEE). Hereinafter, wafer edge expose region, wafer edge exposure region and wafer edge exclusion region are used interchangeably. A third mark type may indicate the border of a portion of the wafer expected to bear a wafer identification mark. A fourth mark type may be located at the center of the wafer to allow for precise and uniform application of liquid resist material to the wafer. The calibration wafer may be employed in methods of rapidly and easily assessing the accuracy of various phases of photolithography processes.

An embodiment of a method, in accordance with the present invention for calibrating a lithography tool, comprises providing a calibration wafer bearing a mark, forming a photoresist material on the calibration wafer to cover the mark, removing a portion of the photoresist material by development, and inspecting the calibration wafer to determine whether a portion of the mark is exposed by removal of the photoresist.

An embodiment of a method, in accordance with the present invention for dispensing liquid photoresist material, comprises providing a calibration wafer bearing a mark proximate to the center of the calibration wafer, flowing a liquid photoresist material onto the calibration wafer, and observing a distance from the mark to a point of application of the liquid photoresist.

An embodiment of an apparatus, in accordance with the present invention for calibrating a lithography tool, comprises a calibration wafer bearing a mark delineating at least one of a center of the calibration wafer, an edge bead removal (EBR) region, a wafer edge exclusion (WEE) region, and a wafer ID region.

Many benefits are achieved by ways of the prevent invention over conventional techniques. For example, the present invention provides an easy to use process that relies on conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, application specific integrated circuits, microprocessor, and other devices. Preferably, the present invention provides a way to calibrate a track tool for lithography processes. Depending upon the embodiment, one or more of these benefits may be achieved. These and other benefits will be described throughout the present specification and more particularly below.

Various additional objects, features and advantage of the present invention can be more fully appreciated with reference to the detailed description and accompanying drawings that follow.

BRIEF DESCRIPTION OF THE DRAWINGS

FIG. 1(aa) is a simplified top view of a portion of the semiconductor wafer of FIG. 1(a).

FIG. 1(ba) is a simplified top view of a peripheral portion of the semiconductor wafer of FIG. 1(b).

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

According to the present invention, techniques for processing for the manufacturing of semiconductor devices are provided. But it would be recognized that the invention has a much broader range of applicability. More particularly, the invention provides a method for monitoring a track tool for lithography process for the manufacturing of integrated circuits. For example, the invention can be applied to a variety of devices such as memory devices, application specific integrated circuits, microprocessors, logic devices, microcontrollers, and others.

A calibration wafer may bear one or more different mark types to facilitate inspection of a lithography process. A first mark type may be located on the outer peripheral portion of the wafer to indicate the desired boundary of an edge bead removal (EBR) region. A second mark type may be located on an outer peripheral portion of the wafer to indicate the desired boundary of a wafer edge expose region (WEE). A third mark type may indicate the border of a portion of the wafer expected to bear a wafer identification mark. A fourth mark type may be located at the center of the wafer in order to allow for precise and uniform application of liquid resist material to the wafer. The calibration wafer may be employed in methods of rapidly and easily assessing the accuracy of various phases of photolithography processes.

The present invention provides an improved calibration method for processing integrated circuits in a track tool for lithography process. Accordingly, device yield per wafer can be improved over conventional method. Further details of the present invention are described throughout the present specification and more particularly below.

Figures 1, 1B:
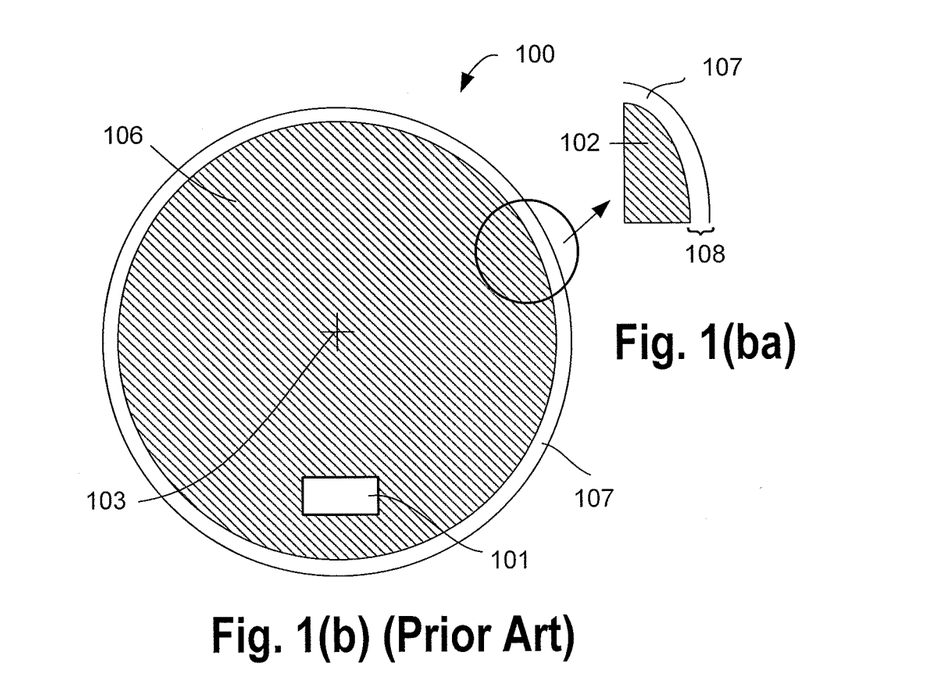
FIG. 1(b) is a simplified top view of a semiconductor wafer illustrating another step of a conventional method for processing a semiconductor integrated device.
Figures 1, 1A:
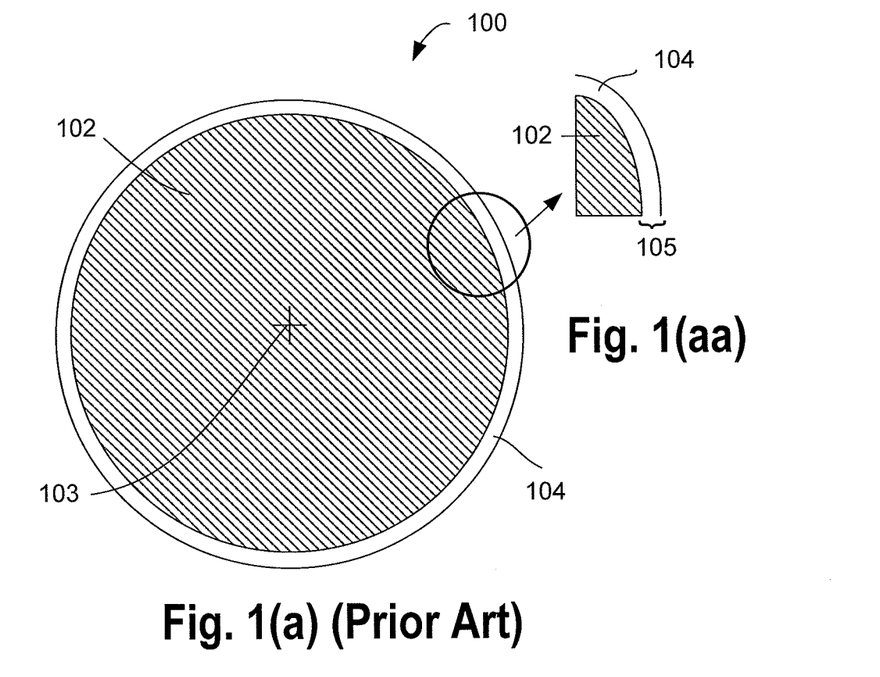
FIG. 1(a) is a simplified top view of a semiconductor wafer illustrating one step of a conventional method for processing a semiconductor integrated device.

FIG. 1(a) is a simplified diagram illustrating a conventional method for processing semiconductor devices. A semiconductor substrate 100 is provided. The semiconductor substrate has a surface. A thickness of a photoresist material 102 is applied to the surface of the semiconductor substrate from a photoresist dispensing nozzle (not shown). The nozzle is configured to dispense liquid undeveloped photoresist to a center region 103 of the wafer. The wafer is spun to distribute the photoresist material over the surface of the semiconductor substrate.

During this spin-on process, it is important to ensure that the photoresist is dispensed as close to the exact center of the semiconductor substrate as possible. If the photoresist material is not dispensed in the center of the substrate, the resulting photoresist material may exhibit non-uniformity over the surface of the semiconductor substrate. In the following description, the terms "wafer" and "substrate" are to be understood as including single crystal silicon, silicon-on-insulator (SOI) or silicon-on-sapphire (SOS) technology, undoped silicon substrates or substrates doped with a suitable impurity, and other semiconductor structures. Furthermore, when reference is made to a "wafer" or "substrate" in the following description, previous process may have been utilized to form regions or junctions in the base semiconductor structure. Further, the semiconductor wafer or substrate may also be based on silicon-germanium, germanium, or the like.

Also shown in FIG. 1(a) is an edge bead removal (EBR) area 104. Specifically, after being spun on the wafer, the photoresist material will extend to the outermost edge of the wafer. Such outermost edge regions of the wafer are not slated to contain active devices, and the presence of photoresist in these areas is a nuisance, and can interfere with wafer handling and pose contamination issues.

Accordingly, prior to performing the active lithography process, the photoresist material is removed from the outermost edge of the wafer in an edge bead removal step. Specifically, a solvent dispensing nozzle is arranged to dispense a solvent to remove photoresist material from the edge bead removal area 104. The edge bead removal area has a predetermined width 105, typically ranging between about 1 mm to about 2 mm in width from the wafer edge.

The EBR step is not directed to portions of the wafer expected to contain active devices. Thus, conventionally the accuracy of the EBR step is confirmed by mere simple visual observation. However, this type of inspection is prone to variation because it depends on the subjective judgment of individual operators. The resulting variation in the width of the EBR region can ultimately lead to defects and device yield loss. Accordingly, there is a need in the art to be able to rapidly and consistently identify the accuracy of the EBR step in a semiconductor fabrication process.

FIG. 1(b) illustrates wafer edge expose (WEE) step in a lithography process. Once the liquid, undeveloped photoresist has been spun onto the wafer, it is typically hardened into a solid material 106 by baking, prior to any exposure steps. Generally, active devices regions on the wafer do not extend all the way to the wafer edge. Accordingly, prior to active lithography of the wafers, photoresist material in a wafer edge expose region 107 may be exposed and developed while photoresist material in other regions on the substrate remains intact. The wafer edge expose region 107 has a predetermined width 108, typically ranging between about 3 mm to about 4 mm from the wafer edge.

Similar to the EBR step described above, the WEE step is not directed to portions of the wafer expected to contain active devices. Thus, the accuracy of the WEE step is generally verified by mere simple visual observation. However, the visual inspection depends on the skill level and subjective judgment of individual operators and leads to variation in the width of the WEE region that may affect device yield. Accordingly, there is a need in the art to be able to rapidly and consistently identify the accuracy of the WEE step in a semiconductor fabrication process.

Also shown in FIG. 1(b) is a wafer identification region 101. Specifically, a standard portion of each wafer is typically excluded from containing active device regions, and is instead earmarked to contain visual information identifying the specific wafer being processed. Wafer identification region 101 is the portion of the wafer that is allocated for holding such visual identification information, and photoresist is typically removed from this identification region prior to submitting the wafer to further precise lithography. The identification region facilitates rapid identification of the wafer.

In general, the step to expose the wafer identification region does not involve portions of the wafer expected to contain active devices. Thus, conventionally the accuracy of removal of photoresist overlying the wafer identification region is verified by mere simple visual observation. However, the visual inspection depends on the subjective judgment of individual operators and may result in irregularity in the dimensions of this region, which can ultimately lead to defects and device yield loss. Accordingly, there is a need in the art to be able to rapidly and consistently identify the accuracy of the wafer ID resist removal step in a in a semiconductor fabrication process.

Figure 2:
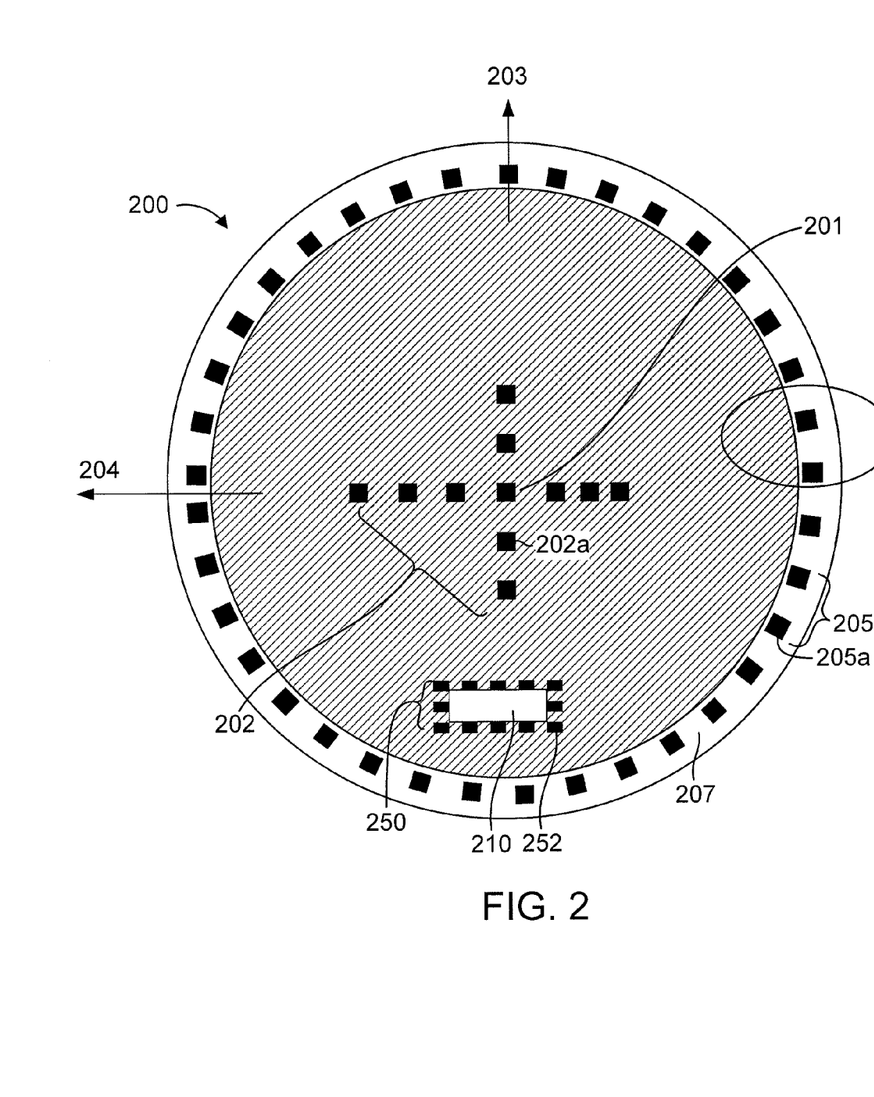
FIG. 2 is a simplified top view of a semiconductor wafer illustrating a method for processing a semiconductor integrated device according to an embodiment of the present invention.
Figure 2A:
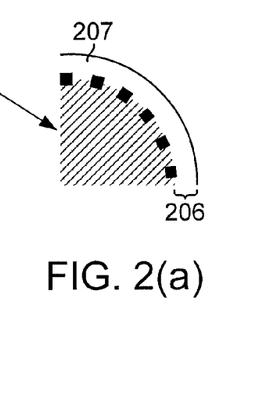
FIG. 2(a) is a simplified view of a portion of the periphery of the semiconductor wafer illustrated in FIG. 2.

FIG. 2 is a simplified diagram illustrating a substrate 200 for calibrating a lithography tool according to some embodiments of the present invention. The diagram is merely an example and should not unduly limit the scope of the claims therein. One of ordinary skill in the art would recognize many variations, alternatives, and modifications. As shown in FIG. 2, a calibration substrate 200 is provided. The calibration substrate can be a silicon wafer or the like. Other substrates may also be used. The calibration substrate 200 has a geometric center 201. A first pattern 202 comprising a first mark type 202a is provided in a center region of the calibration substrate. The first pattern 202 may include a first plurality of the first mark types 202a that are arranged in a first direction 203. The first pattern 202 may also include a second plurality of the first mark types 202a that are arranged in a second direction 204. In some embodiments, the first and second pluralities of the first mark types 202a intersect in a manner similar to a cross-hair, i.e., the first direction and the second direction are arranged to be substantially orthogonal to each other and their intersection is substantially located at the geometric center 201 of the calibration substrate. In a specific embodiment, the first mark type 202a has a substantially square shape ranging from about 0.8 mm to about 1.0 mm in length. The first mark types 202a are spaced in a substantially linear manner in both directions 203 and 204 and at a predetermined distance to each other. Other geometric configurations may also used.

The first pattern 202 of first mark types 202a can be fabricated on the calibration substrate utilizing one or more techniques. For example, in accordance with one embodiment of the present invention, the marks can be fabricated from a dielectric material such as silicon dioxide or silicon nitride using a pattern and etch process. Other suitable materials may also be used, so long as these materials are not altered by the chemistries involved in the removal of photoresist material.

In a specific embodiment, the present invention provides a method for calibrating a lithography tool. The method comprises arranging a photoresist dispensing nozzle to dispense an amount of photoresist material onto the center of a calibration wafer. The center may be identified using the first pattern 202 including the first and second pluralities of the first mark type 202a. The calibration wafer including the amount of photoresist material is subjected to an inspection using a microscope. In some embodiments, the microscope has a predetermined magnification. The method verifies that the amount of photoresist material is applied to the geometric center of the calibration wafer, with reference to the first pattern. The calibration wafer is then removed. The method includes processing one or more production wafers if the photoresist material dispensed from the photoresist dispensing nozzle is in the geometric center of the calibration wafer. Alternatively, the method turns the lithography tool to a maintenance or calibration process.

Referring to FIG. 2, a second pattern 205 includes a plurality of second mark types 205a and is formed on a circumference region of calibration substrate 200. Second mark types 205a have substantially square configurations and delineate the border of etch bead removal (EBR) area 207 lying in the outer part of the peripheral area of the calibration substrate. The EBR area has a predetermined width 206.

In a specific embodiment of the present invention, a method for dispensing liquid photoresist material using a track tool is provided. The method includes providing a calibration wafer having a surface bearing a pattern that is located substantially at the geometric center of the calibration wafer, and depositing a photoresist material overlying the surface of the calibration wafer. The method further includes arranging a solvent dispensing nozzle from the track tool for lithography process to dispense a solvent to remove the photoresist material from the EBR area. In a specific embodiment, the EBR area has a predetermined width ranging from about 1 mm to about 2 mm. The method includes inspecting the calibration wafer including the EBR area using a microscope. The method will subject one or more production wafers to the EBR process if the solvent dispensing nozzle is determined to dispense solvent to remove photoresist material from the calibration wafer from the EBR area. Alternatively, the method turns the track tool to a maintenance or calibration process.

Referring to FIG. 2, a wafer ID region 210 is also shown. The photoresist material overlying the wafer ID region can be removed in an edge bead removal step or a wafer edge expose step depending on the application. Accordingly, a fourth pattern 250 of marks 252 delineates a border of the wafer ID region, allowing rapid visual inspection of the accuracy of removal of photoresist material from the wafer ID region.

Figures 3, 3A:
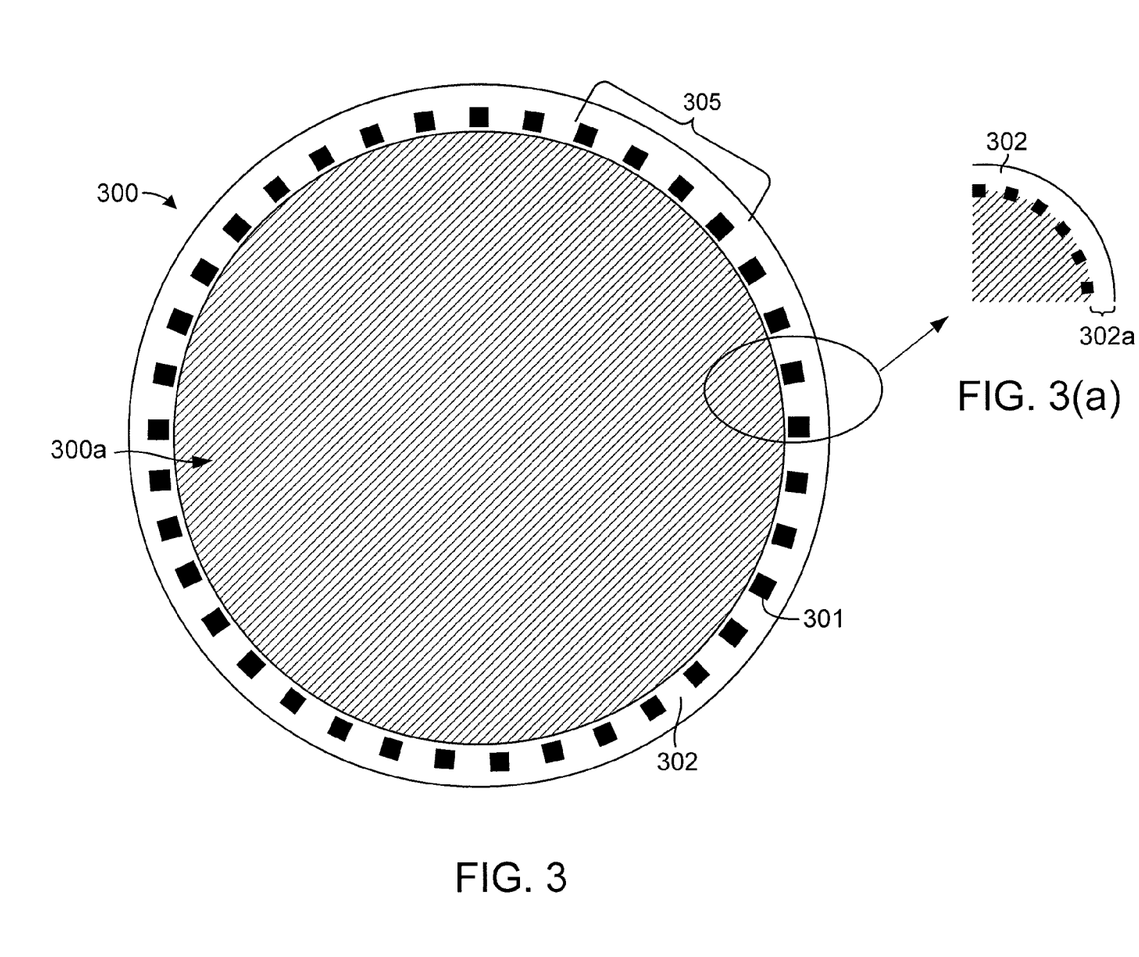
FIG. 3 is a simplified top view of a semiconductor wafer illustrating a method according to an alternative embodiment of the present invention.
FIG. 3(a) is a simplified view of a portion of the periphery of the semiconductor wafer illustrated in FIG. 3.

FIG. 3 shows a simplified diagram illustrating a method for processing semiconductor devices. A calibration substrate 300 is provided. The calibration substrate can be a silicon wafer or the like. Other substrates may also be used.

The calibration substrate 300 has a surface 300a. A pattern 305 of a plurality of third mask types 301 is arranged along a circumference on an outer peripheral surface of the calibration substrate. The third mark types have substantially square configurations. In some embodiments, each of the substantially square configurations has a dimension ranging from about 0.8 mm to about 1.2 mm. In a specific embodiment, pattern 305 including the plurality of third mark types 301 delineates a border of a wafer edge expose region 302 lying in the periphery of the calibration substrate. The wafer edge expose region has a predetermined width 302a. In some embodiments, the predetermined width 302a ranges from about 4 mm to about 6 mm.

Figure 4:
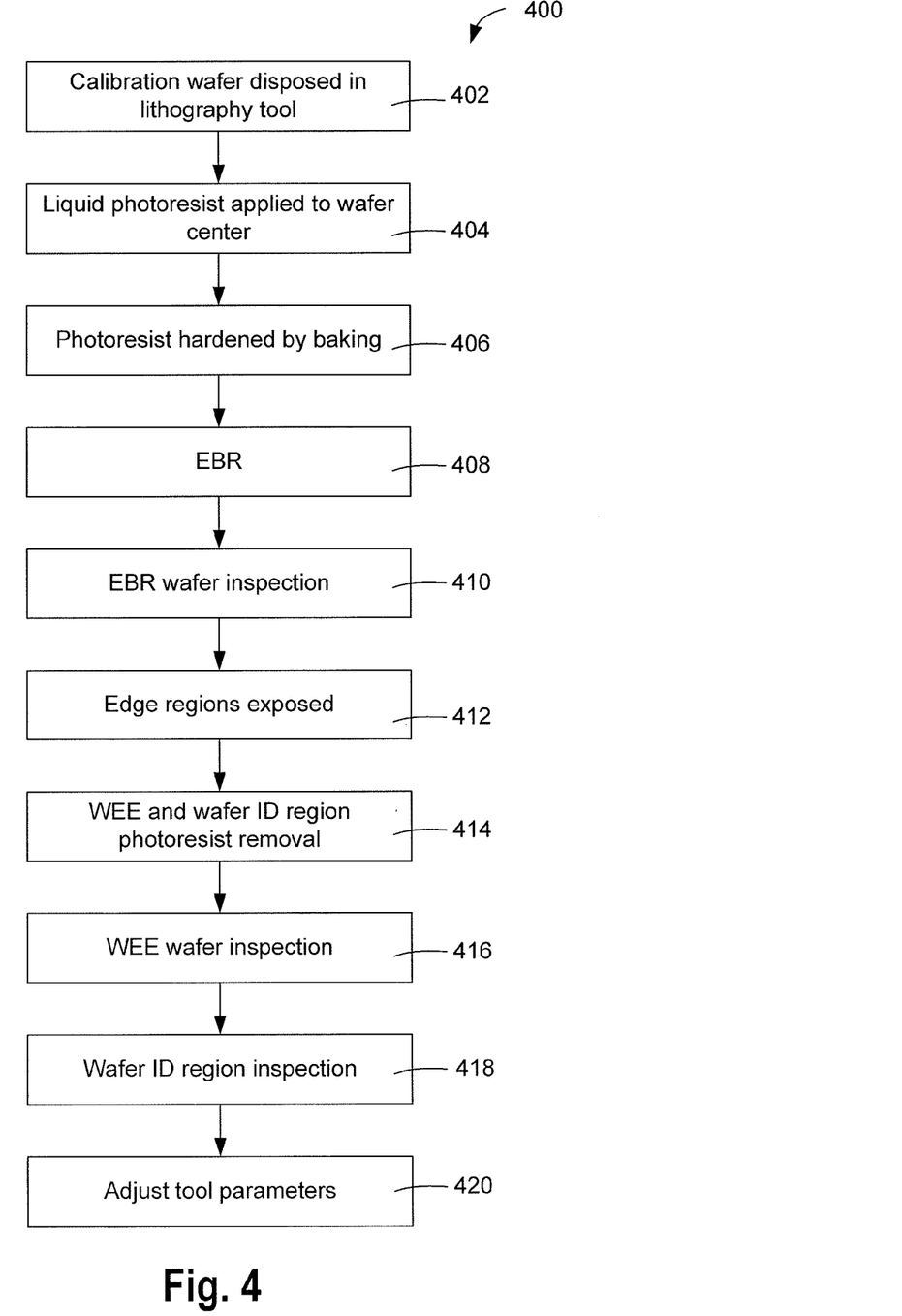
FIG. 4 is a simplified flow chart of an embodiment of a method in accordance with an embodiment of the present invention.

FIG. 4 shows a simplified flow diagram illustrating steps of an embodiment of a method in accordance with the present invention. In step 402 of method 400, a calibration wafer bearing the mark types described is disposed within a processing tool. In step 404, the undeveloped liquid photoresist is applied to the center of the calibration wafer, and a distance between the point of application and the mark at the center of the wafer is determined.

In step 406, the photoresist is hardened by baking, thereby obscuring the marks on the wafer. In step 408, a solvent is applied to the edge portions of the wafer to remove edge beads. In step 410, the outer edge regions of the wafer are inspected to determine alignment of the remaining photoresist with the pattern of marks delineating the EBR region.

In step 412, only the edge regions of the wafer are exposed to radiation to develop photoresist in those wafer edge regions. In step 414, the developed photoresist is removed from the wafer edge regions, and also from the wafer ID regions. In step 416, the inner edge regions of the wafer are inspected to determine alignment of the remaining photoresist with the pattern of marks delineating the WEE region. In step 418, the dimensions of the wafer ID region are inspected to determine alignment of the remaining photoresist with the pattern of marks delineating the wafer ID region.

Based upon the result of the inspection steps 410, 416, and 418, in step 420 various parameters of the lithography tool may be adjusted or reconfigured to bring the results of the photoresist application, EBR, and photoresist development to define WEE and wafer ID regions into accord with predetermined specifications.

An embodiment of a method for calibrating a track tool, in accordance with the present invention, comprises depositing a photoresist material overlying a surface of the calibration substrate. The method includes subjecting the calibrating substrate to a wafer edge expose process, exposing and developing a portion of a photoresist material in the wafer edge expose region and masking the photoresist material in other regions. The method further includes inspecting the calibration wafer including the wafer edge expose region using a microscope having a predetermined magnification. The method then subjects one or more production wafers to the wafer edge exposure process if all the photoresist material is removed from the WEE region on the calibration wafer. Alternatively, the method turns the track tool to a maintenance or calibration process.

A method of fabricating integrated circuit devices using a track tool for lithography process according to an embodiment of the present invention can be summarized as follows:
1. Provide a substrate, e.g., a silicon wafer;
2. Fabricate a calibrating wafer by forming a pattern in the center of the substrate, the pattern comprising a plurality of substantially square configurations;
3. Arrange the calibration wafer in a track tool for lithography process and determine a position of a photoresist dispensing nozzle using the pattern;
4. Verify that the photoresist dispensing nozzle is positioned to dispense photoresist material in the center of the calibration wafer using the pattern;
5. Remove the calibration wafer;
6. Process one or more production wafers using the track tool to dispense photoresist material if the photoresist dispensing nozzle is positioned to dispense photoresist material in the center of the wafer;
7. Perform other steps as needed.

The above sequence of steps is used to provide a calibration wafer and calibration steps for a track tool for a lithography process. As shown, the method provides ways to determine the dispensing of a photoresist material from a photoresist material dispensing nozzle.

In an additional embodiment of the invention, a method of fabricating integrated circuit devices using a track tool for lithography process can be summarized as follows:
1. Provide a substrate, e.g., a silicon wafer;
2. Fabricate a calibrating wafer by forming a pattern on a circumference in a peripheral region of the of the semiconductor substrate, the peripheral region being an edge bead removal region in a lithography process, the pattern includes a plurality of substantially square configurations;
3. Arrange the calibration wafer in a track tool for lithography process and determine a position of a solvent dispensing nozzle using the pattern on the calibration wafer, the solvent dispensing nozzle dispenses a solvent to remove photoresist material in the edge bead removal region;
4. Process one or more production wafers using the track tool to remove photoresist material from the edge bead removal region if the photoresist material is removed from the edge bead removal area on the calibration wafer by the solvent dispensed; and
5. Perform other steps as needed.

The above sequence of steps is used to provide a calibration wafer and calibration steps for a track tool for a lithography process. As shown, the method provides ways to determine the dispensing of a solvent from a solvent dispensing nozzle for a edge bead removal (EBR) process.

In yet another embodiment of the present invention, a method of calibrating a track tool for a lithography process is provided. The method comprises the following steps:
1. Providing a substrate, e.g., a silicon wafer;
2. Fabricating a calibrating wafer by forming a pattern in a wafer peripheral region, the wafer peripheral region being a wafer edge expose region in a lithography process;
3. Depositing a photoresist material on the calibration wafer;
4. Exposing and developing the photoresist material in the wafer edge expose region and mask other region of the calibration wafer;
5. Verifying that the photoresist material is removed from the wafer edge expose area using the pattern;
6. Processing one or more production wafers if the photoresist material in the wafer edge expose region is removed;
7. Performing other steps as needed.

The above sequence of steps is used to calibrate a track tool for lithography process for semiconductor devices according to an embodiment of the present invention. As shown, the method provides ways to determine the removal of photoresist material from a wafer edge expose region.

In a specific embodiment, the invention provides a method for processing semiconductor devices. The method includes providing a calibrating wafer having a same dimension as a production wafer. Preferably the calibration wafer comprises a silicon wafer. The method includes fabricating a pattern in an area at the center of the calibrating wafer. The pattern comprises a plurality of substantially square configurations. The plurality of substantially square configurations are arranged in a first direction and a second direction. The first direction and the second direction are substantially orthogonal to each other and intersect at the geometric center of the calibration wafer. The pattern is fabricated using a dielectric material. The dielectric material can be silicon oxide or silicon nitride or other suitable material. In a specific embodiment, each of the substantially square configurations has a length ranging from about 0.8 mm to about 1.2 mm. Other geometric configurations may also be used. The method includes using the calibration wafer in an alignment process for a track tool for lithography process. The method includes arranging a photoresist dispensing nozzle from the track tool to dispense an amount of photoresist material onto the wafer center. The method includes inspecting the amount of photoresist material using a microscope having a predetermined magnification and better. The method includes operating the track tool on one or more production wafers if the photoresist dispensing nozzle from the track tool dispenses photoresist material in the geometric center of the calibration wafer.

In an alternative specific embodiment, the invention provides a method for processing semiconductor devices. The method includes providing a calibrating wafer having a same dimension as a production wafer. The method includes fabricating a pattern on a circumference in a peripheral region of the calibrating wafer, the peripheral region being a edge bead removal (EBR) area. The edge bead removal area ranges from about 1.0 mm to about 2.0 mm from the wafer edge in some embodiments. The pattern are formed using a dielectric material such as silicon oxide or silicon nitride, among others. The pattern comprises a plurality of substantially square configurations in some embodiments. The method includes depositing a photoresist material overlying the calibration wafer. The method includes dispensing a solvent from a solvent dispensing nozzle in a track tool for lithography process to remove photoresist material from the edge bead removal area. The method includes inspecting the edge bead removal area using a microscope having a predetermined magnification or better. The method includes verifying that the photoresist material is removed from the edge bead removal area. The method includes subjecting one or more production wafer to edge bead removal process if the photoresist material is removed completely from the edge bead removal area by the solvent on the calibration wafer.

In a specific embodiment, the invention provides a method for processing semiconductor devices. The method includes providing a calibrating wafer having a same dimension as a production wafer. A plurality of patterns are formed on a circumference of the calibration wafer, the circumference being in a periphery region of the calibration wafer. In a specific embodiment, a wafer edge expose area lies in the periphery region. Each of the patterns has a substantially square configuration. As merely an example, each of the pattern has a square configuration having a length ranging from about 0.8 mm to about 1.2 mm. Other geometric configuration may also be used. The plurality of patterns are formed using a dielectric material such as silicon dioxide, silicon nitride, among others. The method includes dispensing an amount of photoresist material overlying the calibration wafer. The method includes exposing the wafer edge expose region and masking other region on the calibrating wafer. The method includes inspecting the wafer edge expose region using a microscope having a predetermined magnification or better. The method proceeds by subjecting one or more production wafers to a wafer edge expose process if the photoresist material is removed from the wafer edge expose region on the calibrating wafer.

While the present invention has been described with specific embodiments, it is evident that many variations, modifications, and alternatives will be apparent to those skilled in the art. For example, a single calibration wafer may bear more than one type of mark pattern to facilitate inspection. Thus a calibration wafer could include mark patterns delineating some or each of an EBR region, a WEE region, the wafer center, and a wafer ID region. Alternatively, a single calibration wafer may bear only a single pattern of marks, with separate calibration wafers utilized to calibrate the removal of photoresist from different regions of the wafer.

The above-referenced discussion has focused upon formation and use of a calibration wafer in the form of a substrate comprising semiconductor material, for example a standard single crystal silicon wafer having a diameter of 200 mm or 300 mm. However, while the present invention has been described so far in connection with calibration of processes performed on semiconductor substrates, the invention is not limited to this particular application. Processes performed on other types of substrates, including but not limited to magnetic disc recording media, optical disk recording media, and flat panel displays, may be calibrated utilizing alternative embodiments of methods and apparatuses in accordance with the present invention.

It is also to be understood that the examples and embodiments described herein are for illustrative purposes only and that various modifications or changes in light thereof will be suggested to persons skilled in the art are to be included within the spirit and purview of this application and scope of the appended claims.

What is claimed is:

1. A method for calibrating a lithography tool, the method comprising:
   providing a calibration wafer bearing a pattern comprising a plurality of first marks delineating a border of an edge bead removal (EBR) region and a plurality of second marks delineating a border of a wafer ID region;
   forming a photoresist material on the calibration wafer to cover the pattern;
   removing edge beads disposed in an edge portion of the photoresist material to expose a portion of the first marks;
   inspecting the calibration wafer to determine alignment of a remaining portion of the photoresist material with the exposed portion of the first marks; and
   inspecting the wafer ID region to determine alignment of the remaining portion of the photoresist material with the second marks.

2. The method of claim 1, further comprising, prior to inspecting the wafer ID region:
   exposing edge regions of the photoresist material to radiation to develop the edge regions;
   removing the developed edge regions and from the wafer ID region; and
   inspecting the calibration wafer to determine alignment of the remaining portion of the photoresist material with a plurality of third marks delineating a wafer edge exposure (WEE) region.

3. The method of claim 2, wherein the plurality of third marks is arranged along a circumference on an outer peripheral surface of the calibration wafer and has a substantially squared shape having a length in a range between 0.8 mm and 1.2 mm.

4. The method of claim 2, wherein the wafer edge exposure (WEE) region is disposed on a peripheral surface of the calibration wafer.

5. The method of claim 4, wherein the wafer edge exposure region ranges from about 3 mm to about 4 mm in width from the wafer edge.

6. The method of claim 5, wherein inspecting the calibration wafer comprises using a microscope having a predetermined magnification.

7. The method of claim 1, wherein the calibration wafer comprises single crystal silicon and the pattern comprises a dielectric material.

8. The method of claim 1, wherein each of the first and second marks has a substantially squared shape ranging from about 0.8 mm to about 1.0 mm in length.

9. The method of claim 1, wherein the calibration wafer is selected from the group comprising a semiconductor substrate, an optical recording medium, a magnetic recording medium, and a flat panel display.

10. The method of claim 1, wherein the pattern further comprises a plurality of fourth marks arranged in a first direction and plurality of fifth marks arranged in a second direction, wherein the fourth and fifth marks intersect orthogonally at the center of the calibration wafer.

11. The method of claim 1, wherein the edge bead removal (EBR) region is disposed on a peripheral area of the calibration wafer.

12. The method of claim 8 wherein the edge bead removal region ranges from about 1 mm to about 2 mm in width from the calibration wafer edge.

13. The method of claim 1, wherein removing the edge beads uses a solvent dispensed from a nozzle.

14. An apparatus for calibrating a lithography tool comprising:
a calibration wafer bearing a pattern, the pattern comprising:
plurality of first marks delineating a wafer edge exclusion (WEE) region; and
a plurality of second marks delineating a border of a wafer ID region.

15. The apparatus of claim 14, wherein the pattern further comprises:
a plurality of third marks arranged in a first direction; and
plurality of fourth marks arranged in a second direction, the fourth marks intersecting the third marks orthoginally at the center of the calibration wafer.

16. The apparatus of claim 14, wherein the pattern comprises a dielectric material.

17. The apparatus of claim 14, wherein each of the first and second marks has a substantially squared shape ranging from about 0.8 mm to about 1.0 mm in length.

18. The apparatus of claim 14, wherein the calibration wafer is selected from the group consisting of a semiconductor substrate, a single crystal silicon, an optical recording medium, a magnetic recording medium, and a flat panel display.

19. The apparatus of claim 14, wherein the first pattern lies about 6 mm or less in width from the calibration wafer edge.

* * * * *